(12) United States Patent
Frank et al.

(10) Patent No.: US 7,078,812 B2
(45) Date of Patent: Jul. 18, 2006

(54) ROUTING DIFFERENTIAL SIGNAL LINES IN A SUBSTRATE

(75) Inventors: Mark D. Frank, Longmont, CO (US); Jerimy Nelson, Fort Collins, CO (US); Peter Shaw Moldauer, Wellington, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 45 days.

(21) Appl. No.: 10/929,989

(22) Filed: Aug. 30, 2004

(65) Prior Publication Data
US 2006/0043537 A1   Mar. 2, 2006

(51) Int. Cl.
 H01L 23/48 (2006.01)
 H01L 23/52 (2006.01)
 H01L 29/40 (2006.01)

(52) U.S. Cl. ............ 257/758; 257/774; 257/776; 257/E23.011; 257/E23.019

(58) Field of Classification Search ............ 257/758, 257/774, 776
See application file for complete search history.

(56) References Cited

U.S. PATENT DOCUMENTS

| | | | |
|---|---|---|---|
| 4,649,417 A | 3/1987 | Burgess et al. | |
| 5,831,832 A | 11/1998 | Gillette et al. | |
| 6,150,724 A | 11/2000 | Wenzel et al. | |
| 6,594,153 B1 | 7/2003 | Zu et al. | |
| 6,617,243 B1 | 9/2003 | Weekly | |
| 6,700,794 B1 | 3/2004 | Vinson et al. | |
| 2003/0206405 A1 | 11/2003 | Zu et al. | |
| 2004/0084768 A1* | 5/2004 | Devnani et al. | 257/734 |
| 2004/0098690 A1 | 5/2004 | Joseph et al. | |
| 2005/0121766 A1* | 6/2005 | Devnani et al. | 257/691 |

OTHER PUBLICATIONS

IBM; "Blue Logic High-Speed SERDES Family of Cores"; Aug. 2003; 4 pages.

* cited by examiner

Primary Examiner—Ngân V. Ngô

(57) ABSTRACT

A method for routing signals in a multilayer substrate is disclosed. One embodiment of a method may comprise providing a multilayer substrate with at least one differential signal line pair aligned along a common plane that is substantially transverse to a top surface of the multilayer substrate, jogging a first differential signal line associated with a differential signal line pair at a first redistribution layer in a direction along the common plane, and jogging a second differential signal line associated with the differential signal line pair at a second redistribution layer along the common plane in a same direction as the first differential signal line to provide a substantially balanced differential signal line pair.

29 Claims, 9 Drawing Sheets

ROUTING DIFFERENTIAL SIGNAL LINES IN A SUBSTRATE

BACKGROUND

Controlled collapse chip connection (C4) or flip-chip technology has been successfully used for interconnecting high I/O (input/output) count and area array solder bumps on silicon chips to base ceramic chip carriers, for example alumina carriers. In C4 technology or flip chip packaging, one or more integrated circuit chips are mounted above a single or multiple layer ceramic (MLC) substrate or board, and pads on the chip(s) are electrically or mechanically connected to corresponding pads on the other substrate by a plurality of electrical connections, such as solder bumps.

In MLC packages, a ceramic substrate is the platform upon which chips, passive components, protective lids, and thermal enhancement hardware are attached. Wiring patterns within the substrate carrier define escape paths in single chip modules (SCMs) and multichip modules (MCMs), transforming the tight I/O pitch at the die level of the chips to a workable pitch at the board level. The wiring pattern also establishes the modules' power distribution network. Vertical metal vias provide interconnections between the various layers within the MLC. C4 pads can be directly soldered onto MLC vias, providing low inductance, and direct feed to power and ground planes.

One aspect contributing to the non uniformity of the carrier surface is related to a condition referred to as via-bulge. During firing, the expansion/contraction of the typical conductive paste is not the same as that for the typical dielectric material encompassing the vias and etch lines. Therefore, vias which protrude from the surface and that go into the substrate through many layers will tend to form hills on the carrier's mounting surface, and will produce via-bulge. Accordingly, vias need to be jogged every six to eight layers to mitigate via bulge. "Jogging" means that a via includes a bend or transition that is substantially transverse to the via direction between layers. For example, a vertical metal via that provides interconnections between layers is typically jogged horizontally along a "redistribution layer" to a location spaced from the vertical metal via. A new via is provided which then can continue vertically to one or more additional layers spaced below the redistribution layer, or the via can be grouped together with one or more other vias to reduce the number of vias for routing to additional layers. The redistribution layer is a layer in which the vias can be jogged and/or grouped together employing conductive lines, so that the vias can be moved to other locations on the redistribution layer, or so that the number of vias can be reduced. The redistribution layers are typically power layers, ground layers and signal layers.

Routing of signal lines through a ceramic substrate begins at a die/package interface where signals, ground and power escape the pin field of a given die. The arrangement of the signal, ground and power pins (or C4s) is a reflection of the logic blocks on the die. Certain logic blocks rely on differential signal line pairs to effectively transmit and receive high speed signals. Therefore, the routing of the differential signal line pairs can be restricted based on a particular connection points specified by the logic blocks, the need to jog every six to eight layers, and the available routing area.

SUMMARY

One embodiment of the present invention may comprise a method for routing signals in a multilayer substrate. The method may comprise providing a multilayer substrate with at least one differential signal line pair aligned along a common plane that is substantially transverse to a top surface of the multilayer substrate, jogging a first differential signal line associated with a differential signal line pair at a first redistribution layer in a direction along the common plane, and jogging a second differential signal line associated with the differential signal line pair at a second redistribution layer along the common plane in a same direction as the first differential signal line to provide a substantially balanced differential signal line pair.

Another embodiment may comprise a method for routing differential signal lines in a multilayer ceramic substrate (MLC). The method may comprise providing a plurality of differential signal line pair groups. Each differential signal line pair group may be aligned along a respective common plane that is substantially transverse to a top surface of the multilayer substrate. A first differential signal line associated with each differential signal line pair group may be jogged at a first redistribution layer in a direction along the common plane associated with the respective differential signal line pair group. A second differential signal line of each differential signal line pair group may be jogged at a second redistribution layer, in a same direction as the first differential signal line associated with a respective differential signal line pair group, along the common plane associated with the respective differential signal line group.

Yet another embodiment of the present invention may relate to a multilayer ceramic (MLC) substrate. The substrate may comprise a first differential signal line associated with a differential signal line pair that is jogged a given distance at a first redistribution layer in a direction along a common plane that is substantially transverse with a top surface of the substrate. The substrate may also comprise a second differential signal line associated with the differential signal line pair that is jogged substantially the same given distance at a second redistribution layer along the common plane in a same direction as the first differential signal line to provide a substantially balanced differential signal line pair.

DETAILED DESCRIPTION

Figure 1:
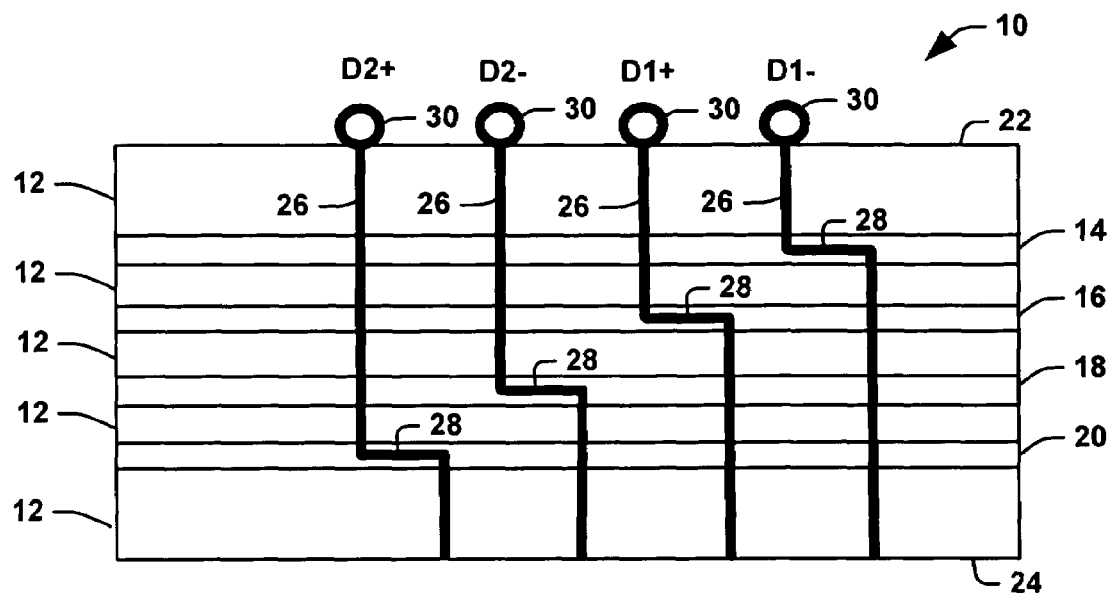
FIG. 1 illustrates a cross-sectional view of an embodiment of a portion of a multilayer substrate.

This disclosure relates generally to routing differential signal lines or vias in a multilayer substrate (e.g., multilayer ceramic substrate). The differential signal lines or vias can provide coupling connections from an integrated circuit or die to a printed circuit board (PCB) or other layered structure. The differential signal lines include an escape pattern that provides for substantially balancing of differential signal line pairs. A first differential signal line of a given differential signal line pair is jogged at a first redistribution layer, while a second differential signal line of the given differential signal line pair is jogged at a second redistribution layer that is subsequent and spaced apart from the first redistribution layer. The first and second differential signal lines are jogged in a same direction along a common plane that is substantially transverse to a top surface of the multilayer substrate. The above routing pattern provides for a substantially balanced differential signal line pair and minimizes discontinuities, while optimizing signal integrity.

An escape pattern refers to a routing pattern from a package/die interface or first bonding surface of the substrate, to a distal layer of the substrate. The distal layer can include one or more intermediate layers or a second bonding surface on an opposite side of the first bonding surface. A "subsequent layer" as used in this disclosure refers to a layer that is disposed between the second bonding surface and a layer in which the subsequent layer is referencing. A "redistribution layer" as used in this disclosure refers to a layer in which the vias can be jogged and/or grouped together employing conductive lines, so that the vias can be moved to other locations on the redistribution layer, or so that the number of vias can be reduced. A redistribution layer is typically a power layer, a ground layer or a signal layer. The term "balanced" as used in this disclosure refers to two conductors being operated in such a ways that when the voltages of the two conductors at transverse planes are substantially equal in magnitude and opposite in polarity with respect to ground, the currents in the two conductors are substantially equal in magnitude and opposite in direction.

In one embodiment, a plurality of differential signal lines are grouped in sets of differential signal line pairs. Differential signal lines in a given group are aligned along a common plane (e.g., in a row) that is transverse to a top surface of the multilayer substrate. A given signal line connection block can include one or more groups of differential signal line pairs along different respective common planes. Each differential signal line in a given group aligned along a common plane that is transverse from a top surface of the multilayer substrate is jogged in different and subsequent redistribution layers in a same direction along the common plane. This mitigates interference between adjacent differential signal line pairs and provides for substantially balancing of respective differential signal line pairs in the given group.

Additionally, adjacent blocks can include similar escape patterns with differential signal line groups that reside in the common plane with differential signal line groups of other adjacent blocks. Each differential signal line in a given group aligned along the common plane that is transverse to a top surface of the multilayer substrate is jogged in different redistribution layers in a same direction for all differential signal lines that reside in the group.

FIG. 1 illustrates a portion of a multilayer substrate 10 having a plurality of vias routed therethrough. The vias can include power lines, ground lines, and signal lines. The signal lines can include differential signal lines. The multilayer substrate 10 can be a multilayer ceramic substrate, printed circuit board, semiconductor structure, or other multilayer structure for routing signals therethrough. The multilayer substrate 10 includes a plurality of redistribution layers 14, 16, 18, 20 interposed between a plurality of dielectric layers 12. The redistribution layers 14, 16, 18, 20 can be ground layers, power layers and/or stand-alone redistribution layers for routing signal lines, ground lines and power lines. A redistribution layer can be formed from one or more layers, such that vias can be routed between or partially in one or more layers. The multilayer substrate 10 includes a plurality of differential signal line pairs (e.g., D1+, D1− and D2+, D2−) routed from a top bonding surface 22 of the substrate 10 to a bottom bonding surface 24 of the substrate 10. The differential signal line pairs include vertical portions 26 that are jogged or include via jogs 28 at the redistribution layers 14, 16, 18, 20 to mitigate via bulging on the top surface of the multilayer substrate 10.

Connecting bumps 30 (e.g., C4 bumps) are formed on the top bonding surface 22 of the multilayer substrate 10 to provide coupling of the differential signal line pairs to connection points on an integrated circuit die. The connection points of the integrated circuit die can be coupled to functional circuitry, such as an Input/Output (I/O) device (e.g., a serializer/deserializer) (not shown) of an integrated circuit. The bottom bonding surface 24 of the multilayer substrate 10 is coupled to a ball grid array (BGA) (not shown) for coupling to a printed circuit board, or other substrate device (not shown).

The differential signal line pairs have a routing pattern or escape pattern that reduces layer count, while maintaining signal integrity. This is accomplished by jogging differential signal lines along a same direction in a common transverse plane (i.e., a plane that is transverse to a top surface of the multilayer substrate 10) at different corresponding redistribution layers for different differential signal lines to maintain substantially balanced differential signal line pairs that do not interfere with adjacent differential signal line pairs. A substantially balanced differential signal line pair is provided by via jogging differential signal lines of an associated differential signal line pair in subsequent redistribution layers in a same direction within the common transverse plane, such that differences in the distance between differential signal lines of the same differential signal line pair is minimized. Therefore, signals carried on the differential signal lines of a given pair experience the same signal environment and maintain a substantially constant impedance and a low common mode rejection ratio (CMMR).

Additional pairs of differential signal lines distributed in a group or row with the differential signal line pair along a common plane that is transverse to a top layer of the multilayer substrate are jogged in the same direction in subsequent redistribution layers in a similar manner, so as not to interfere with the differential signal line pair and adjoining differential signal line pairs that may lie in separate and adjacent connection blocks.

As illustrated in FIG. 1, a first differential signal line D1− of a first differential signal line pair (D1) extends from a connection point (e.g., C4 bump 30) on the top bonding surface 22 of the multilayer substrate 10 to a first redistribution layer 14. The first differential signal line D1− is jogged (i.e., has a via jog or a jog portion 28) at the first redistribution layer 14 in a direction along a common plane that is substantially transverse to the top surface of the multilayer substrate 10. The first differential signal D1− then continues extending through the multilayer substrate 10. A second differential signal line D1+ of the first differential signal line pair (D1) extends from a connection point on the top surface of the multilayer substrate 10 to a second redistribution layer 16. The second differential signal line D1+ is jogged (i.e., has a via jog or a jog portion 28) at the second redistribution layer 16 in the same direction as the first differential signal line D1− along the common plane, and then continues extending through the multilayer substrate 10. The first and second differential signal lines can be jogged substantially the same given distance to minimize distance variation between the first and second differential signal lines. The routing pattern of the first differential signal line and the second differential signal line provide for maintaining a substantially balanced differential signal line pair by routing and jogging the differential signal lines in the same direction along a common plane substantially the same distance, and minimizing the distance variation between the first and second differential signal lines.

A third differential signal line D2− of a second differential signal line pair (D2) extends from a connection point (e.g., C4 bump) on a top bonding surface 22 of the multilayer substrate 10 to a third redistribution layer 18. The third differential signal line D2− is jogged (i.e., has a via jog or a jog portion 28) at the third redistribution layer 18 in the same direction as the first differential signal line D1− and the second differential signal line D1+ along the common plane, and then continues extending through the multilayer substrate 10. A fourth differential signal line D2+ of the second differential signal line pair extends from a connection point 30 on the top bonding surface 22 of the multilayer substrate 10 to a fourth redistribution layer 20. The fourth differential signal line D2+ is jogged (i.e., has a via jog or a jog portion 28) at the fourth redistribution layer 20 in the same direction as the first differential signal line D1−, the second differential signal line D1+ and the third differential signal line D2−, along the common plane, and then continues extending through the multilayer substrate 10. The third and fourth differential signal lines can be jogged substantially the same given distance to minimize distance variation between the third and fourth differential signal lines. The given jogging distance between the third and fourth differential signal lines can be the same or different as the given jogging distance of the first and second differential signal lines. The routing pattern of the third differential signal line D2− and the fourth differential signal line D2+ provide for maintaining a substantially balanced differential signal line pair associated with the third and fourth differential signal lines by routing and jogging the differential signal lines in the same direction along a common plane, and minimizing the distance variation between the first and second differential signal lines of the second differential signal line pair.

The first differential signal line pair and the second differential signal line pair can form a group or row of differential signal line pair signal sets in a signal line connection block, such that multiple rows (e.g., 2, 4, 8, 16) of differential signal line pair sets (e.g., 2 pair sets) can reside in a signal line connection block. Additionally, multiple signal line connection blocks can reside in a side-by-side fashion or in a connection block array. By jogging differential signal lines over subsequent layers in a given row in a same direction along a common plane for one or more rows and/or one or more blocks, differential signal line integrity can be maintained and differential signal lines can be balanced without interfering with signals in other signal rows and/or blocks. In one embodiment, the first redistribution layer 14 is a ground layer, the second redistribution layer 16 is a power layer, the third redistribution layer 18 is a ground layer and the fourth redistribution layer 20 is a power layer.

Figure 2:
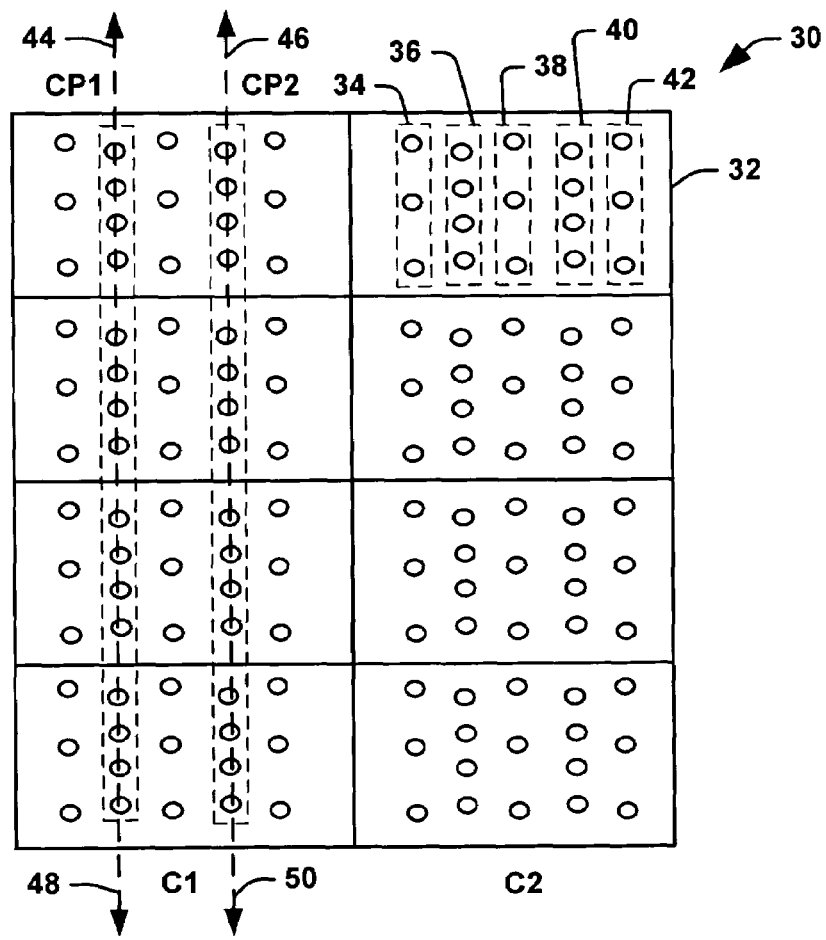
FIG. 2 illustrates an embodiment of a portion of a top surface of a multilayer substrate having a plurality of multiple signal line connection blocks.

FIG. 2 illustrates a portion of a top surface of a multilayer substrate 30 having a plurality of multiple signal line connection blocks 32. The plurality of multiple signal line connection blocks 32 reside in a side-by-side fashion or an array that includes a first column (C1) of four connection blocks side-by-side with a second column (C2) of four connection blocks. Each connection block 32 includes a similar signal escape pattern for routing signals from connection bumps (e.g., C4 bumps) on a top surface through the multilayer substrate 30 to connection bumps (e.g., BGA) on a bottom surface of the multilayer substrate 30. As illustrated in FIG. 2, each block 32 includes a first row of two differential signal line pairs 36 located between a row of power lines 34 and a row of ground lines 38, and a second row of two differential signal line pairs located between the row of ground lines 38 and a row of power lines 42. The power lines 34 and the power lines 42 can be power lines from the same power supply or different power supplies. It is to be appreciated that adjacent blocks can have two rows of ground lines with power supply lines in between, such that each block interleaves between two supply line rows and one ground line row and two ground line rows and one supply line row.

Each group or row of differential signal lines in a respective block 32 form a set of four differential signal lines or two differential signal line pairs. Each block 32 includes a first set or row of differential signal line pairs that are aligned along a common plane that is transverse with a top surface of the multilayer substrate. Additionally, each block includes a second set or row of differential signal line pairs that are aligned along a common plane that is transverse with a top surface of the multilayer substrate. Each of the first sets of differential signal line pairs across connection block in the same column are coplanar along the same common plane. Additionally, each of the second sets of differential signal line pairs across connection blocks in the same column are coplanar along the same common plane. Jogging of differential signal line pairs in each of the connections blocks that are aligned along the same common plane are jogged in a same direction, so as not to interfere with differential signal lines in adjacent blocks.

For example, differential signal line pairs in each of the connections blocks of the first column (C1) are aligned along a first common plane (CP1) can be jogged in the direction of arrow 44. Alternatively, differential signal line pairs in each of the connections blocks of the second column that are aligned along the first common plane (CP1) can be jogged in the direction of arrow 48. Differential signal line pairs in each of the connections blocks of the first column that are aligned along a second common plane (CP2) can be jogged in the direction of arrow 46. Alternatively, differential signal line pairs in each of the connections blocks of the first column that are aligned along the second common plane (CP2) can be jogged in the direction of arrow 50. It is to be appreciated that differential signal line pairs aligned along the first common plane (CP1) can be jogged in different direction or the same direction as the differential signal line pairs aligned along the second common plane (CP2). Although it may be desirable to jog signals toward the outer perimeter of the multilayer substrate.

In one embodiment, a first differential signal line of each differential signal line row of four is jogged at a first redistribution layer. The first differential signal lines of each coplanar row of differential signal lines across blocks in a column are jogged in a same direction along a first common plane that is transverse with a top surface of the multilayer substrate. A second differential signal line of each differential signal line row of four is jogged at a second redistribution layer. The second differential signal lines of each coplanar row of differential signal lines across blocks in a column are jogged in a same direction along a second common plane that is transverse with a top surface of the multilayer substrate. A third differential signal line of each differential signal line row of four is jogged at a third redistribution layer. The third differential signal lines of each coplanar row of differential signal lines across blocks in a column are jogged in a same direction along a third common plane that is transverse with a top surface of the multilayer substrate. A fourth differential signal line of each differential signal line row of four is jogged at a fourth redistribution layer. The fourth differential signal lines of each coplanar row of differential signal lines across blocks in a column are jogged in a same direction along a fourth common plane that is transverse with a top surface of the multilayer substrate. The first, second, third and fourth common planes are substantially parallel to one another, such that differential signal lines can be jogged in a same direction or opposite direction across the different common planes.

Figure 3:
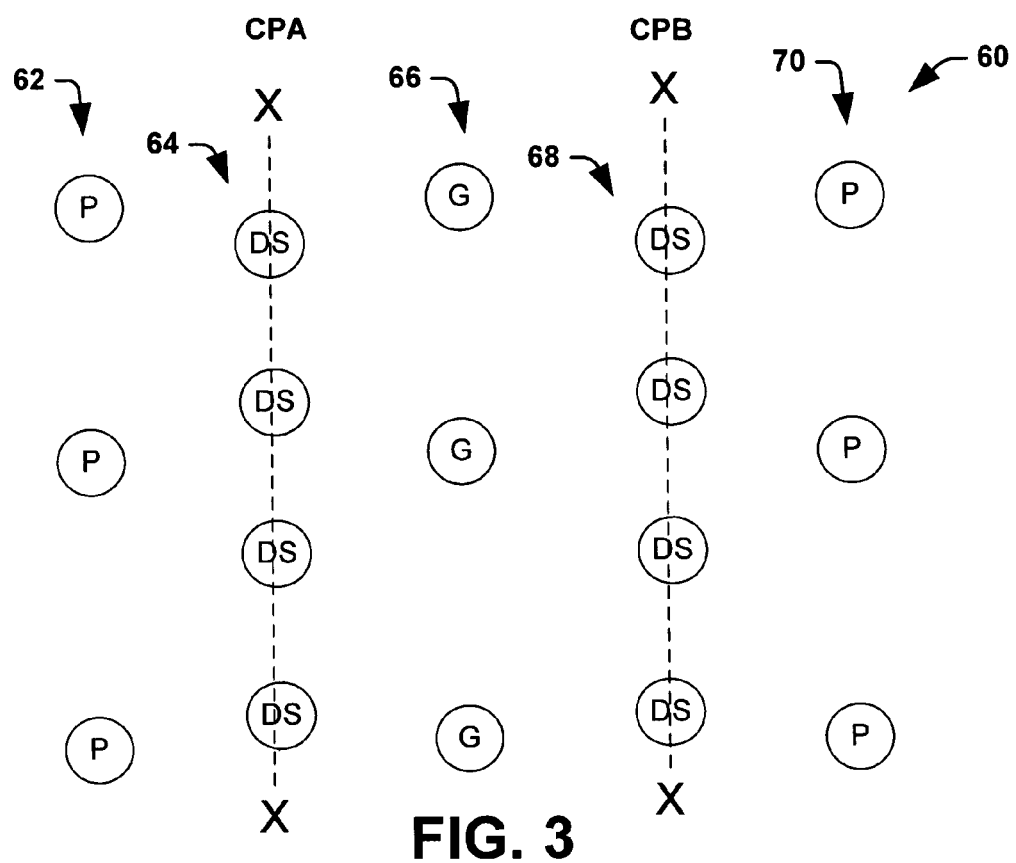
FIG. 3 illustrates an embodiment of an escape pattern of a top surface layer of a multilayer substrate associated with a four differential signal line pair connection block.

FIGS. 3–7 illustrate routing layers of a four differential signal line pair connection block. FIG. 3 illustrates an escape pattern of a top surface layer 60 of a multilayer substrate associated with the four differential signal line pair connection block. The four differential signal line pair connection block includes a first differential signal line row 64 of four differential signal lines (DS) forming a first and second differential signal line pair distributed along a first common plane (CPA), and a second differential signal line row 68 of four differential signal lines (DS) forming a third and fourth differential signal line pair distributed along a second common plane (CPB). The "X's" denote that the first and second common planes are directed into the multilayer substrate substantially transverse to a top surface of the multilayer substrate. The first differential signal line row 64 resides between a power line row 62 and a ground line row 66, and the second differential signal line row 68 resides between the ground line row 66 and a power line row 70. The power line row 62 and the power line row 70 can be power lines from the same power supply or different power supplies.

Figure 4:
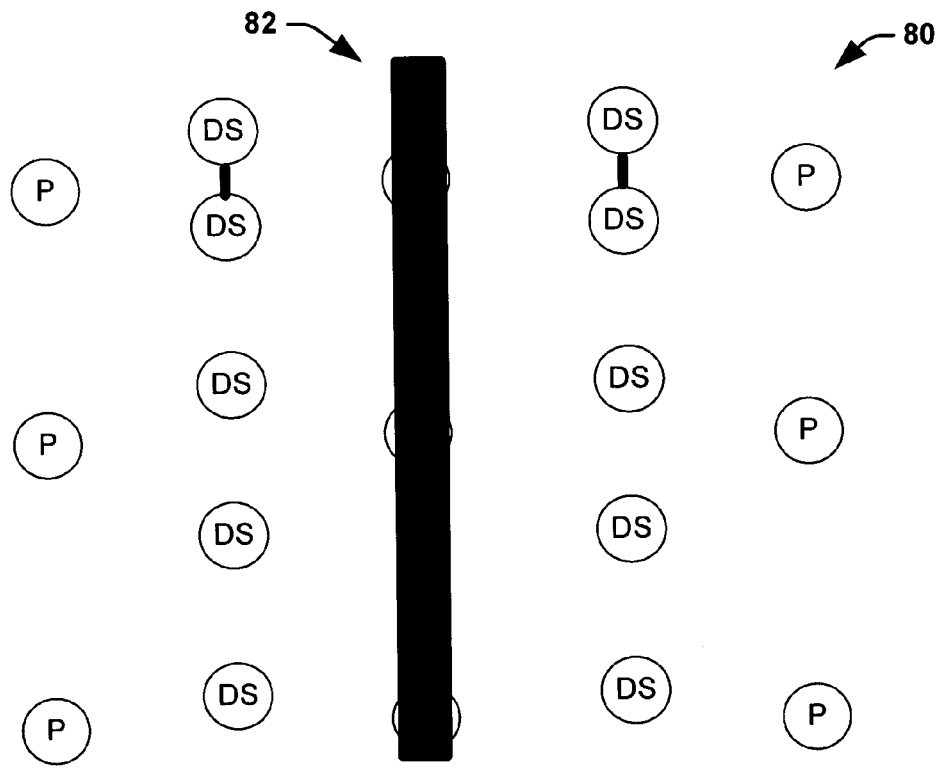
FIG. 4 illustrates an embodiment of a first ground layer associated with the four differential signal line pair connection block.

FIG. 4 illustrates a first ground layer 80 associated with the four differential signal line pair connection block. The first ground layer 80 is spaced apart from the top surface layer by, for example, a dielectric layer. The ground lines 66 are redistributed in the ground layer over one or more conductive lines 82. The redistribution mitigates the need for jogging of the ground lines. Additionally, a first differential signal line of a first differential signal line pair of each of the first and second differential signal line rows 64 and 66 are jogged at the first ground layer in a same direction along the first and second common planes, respectively.

Figure 5:
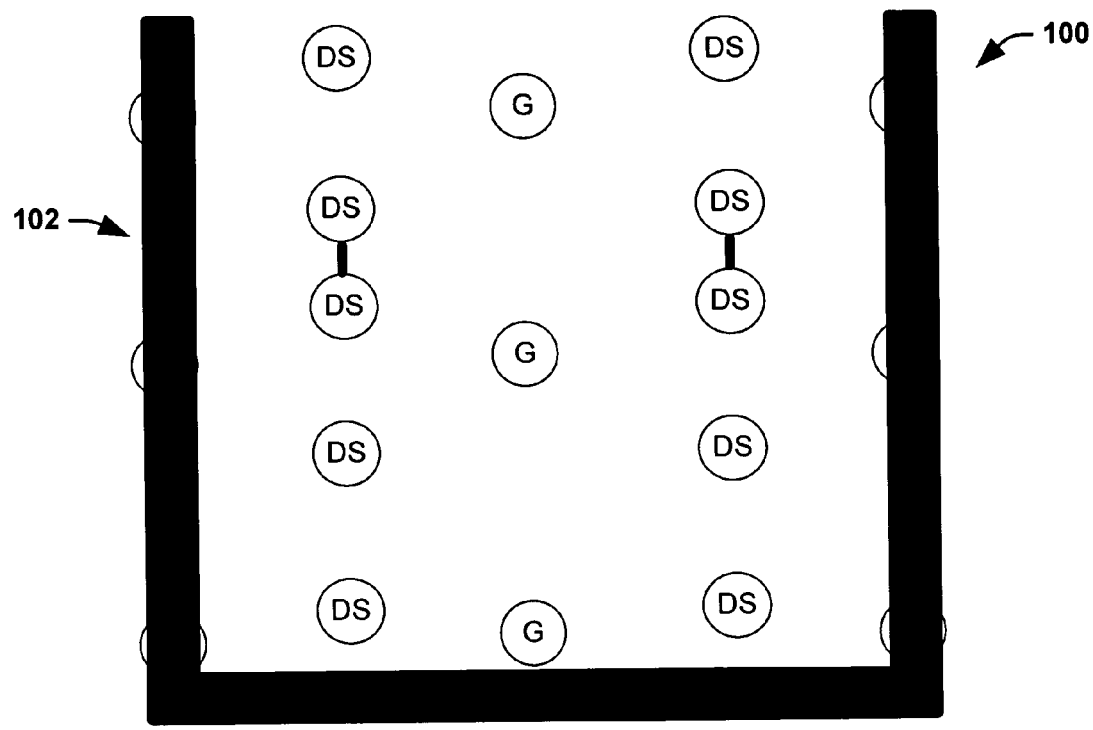
FIG. 5 illustrates an embodiment of a first power layer associated with the four differential signal line pair connection block.

FIG. 5 illustrates a first power layer 100 associated with the four differential signal line pair connection block. The first power layer 100 is spaced apart from the first ground layer 80 by, for example, a dielectric layer. The power lines 62 and/or 70 are redistributed in the power layer over one or more conductive lines 102. The redistribution mitigates the need for jogging of the power lines. Additionally, a second differential signal line of the first differential signal line pair of each of the first and second differential signal line rows 64 and 68 are jogged at the first power layer 100 in a same direction along the first and second common planes as the first differential signal lines were jogged in the first ground layer 80.

Figure 6:
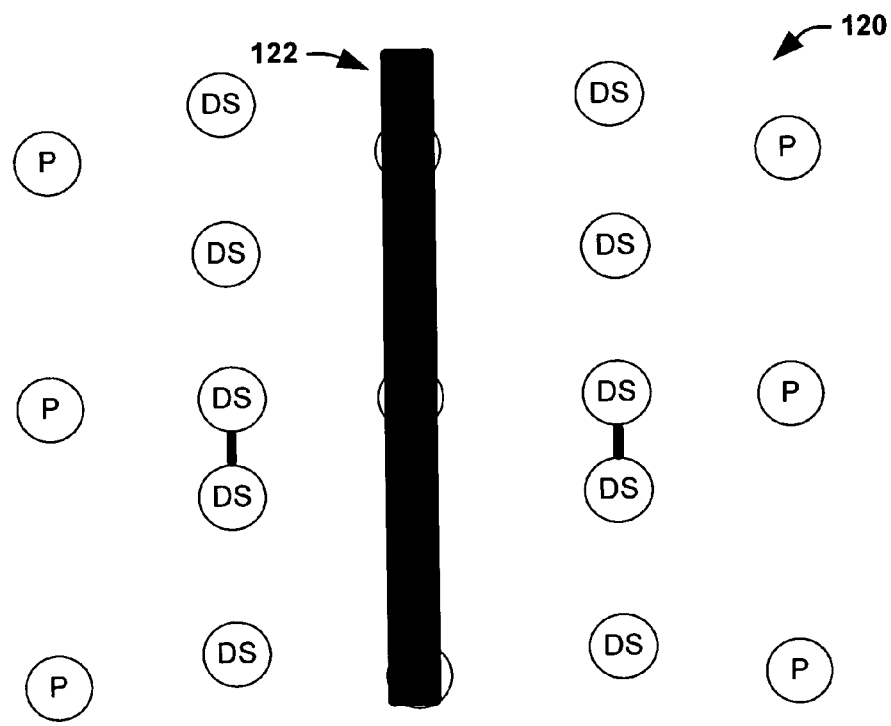
FIG. 6 illustrates an embodiment of a second ground layer associated with the four differential signal line pair connection block.

FIG. 6 illustrates a second ground layer 120 associated with the four differential signal line pair connection block. The second ground layer 120 is spaced apart from the first power layer 100 by, for example, a dielectric layer. Ground signals are redistributed in the second ground layer 120 over one or more conductive lines 122. Additionally, a third differential signal line of a second differential signal line pair of each of the first and second differential signal line rows are jogged at the second ground layer 120 in a same direction along the first and second common planes as the first differential signal lines were jogged in the first ground layer 80, and the second differential signal lines were jogged in the first power layer 100.

Figure 7:
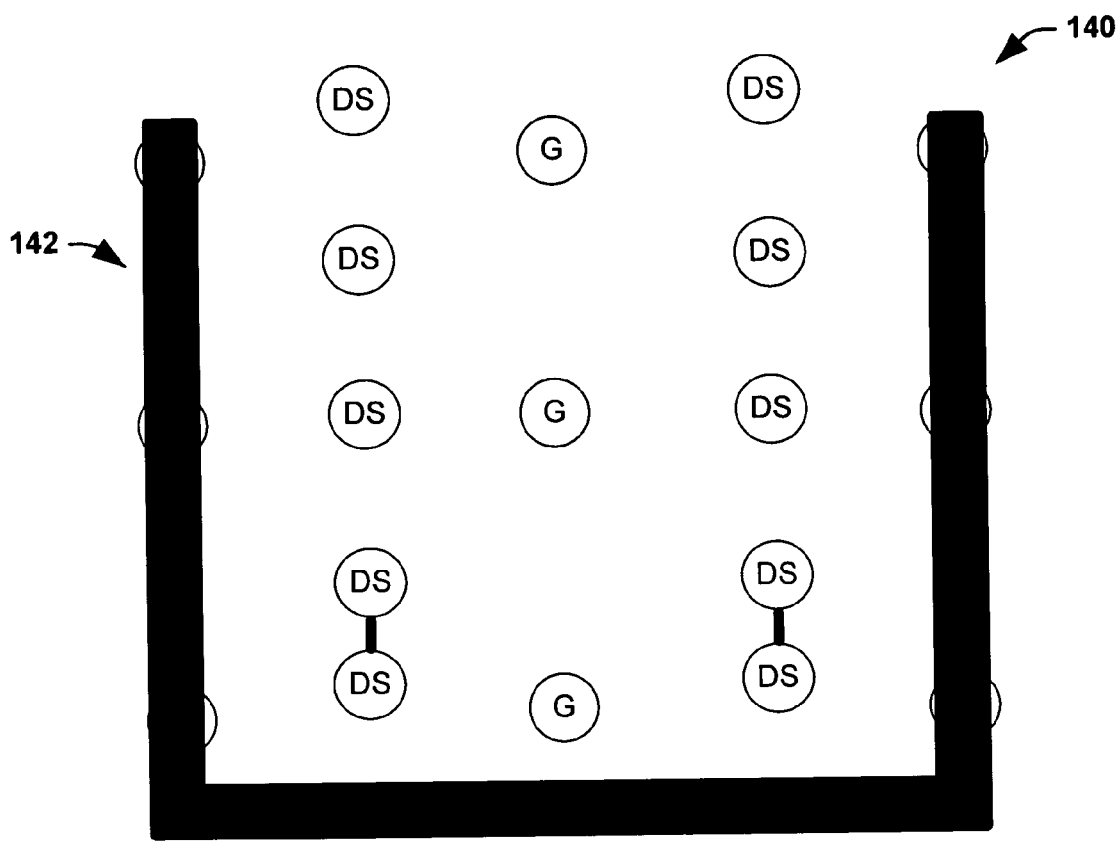
FIG. 7 illustrates an embodiment of a second power layer associated with the four differential signal line pair connection block.

FIG. 7 illustrates a second power layer 140 associated with the four differential signal line pair connection block. The second power layer 140 is spaced apart from the second ground layer 120 by, for example, a dielectric layer. Power lines are redistributed in the power layer over one or more conductive lines 144. Additionally, a fourth differential signal line of the second differential signal line pair of each of the first and second differential signal line rows are jogged at the second power layer 120 in a same direction along the first and second common planes as the first differential signal lines were jogged in the first ground layer 80, the second differential signal lines were jogged in the first power layer 100, and the third differential signal lines were jogged in the second ground layer 120. The first power layer 100 and the second power layer 140 can correspond to a same or different power supply. It is to be appreciated that the signals in the first common plane can be jogged in a same or different direction of the signal line in the second common plane as long as signal lines in adjoining blocks in the same common plane are jogged in the same direction.

Figure 8:
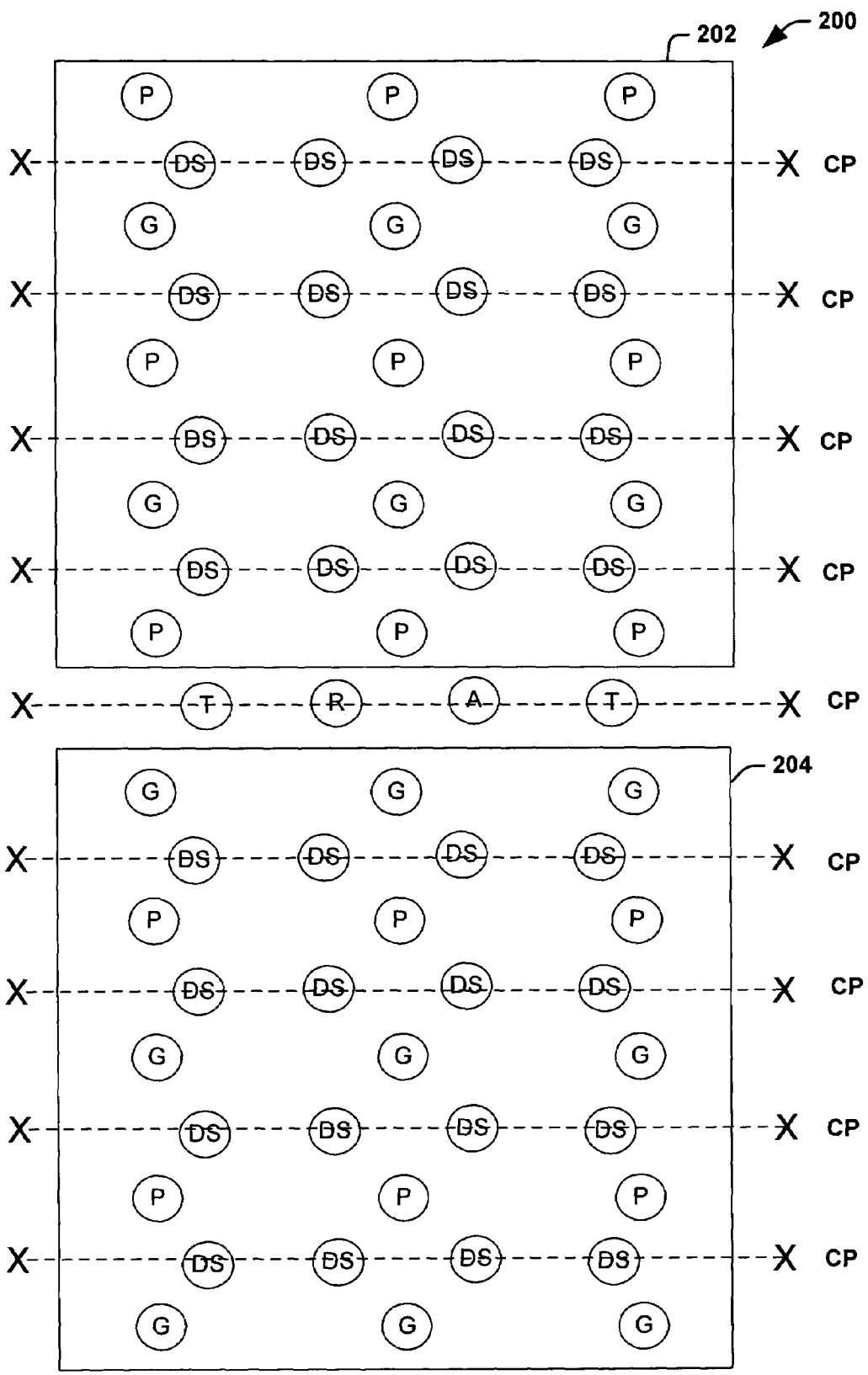
FIG. 8 illustrates an embodiment of an escape pattern of a top surface layer of a multilayer substrate associated with a sixteen differential signal line pair connection block.

FIGS. 8–12 illustrate routing layers of a sixteen differential signal line pair connection block. FIG. 8 illustrates an escape pattern of a top surface layer 200 of a multilayer substrate associated with the sixteen differential signal line pair connection block. The sixteen differential signal line pair connection block includes eight differential signal line rows of four differential signal lines (DS). Each differential signal line row includes two differential signal line pairs that are distributed along a corresponding common plane (CP) associated with a respective differential signal line row. A first portion 202 of the connection block includes four differential signal line rows, and a second portion 204 of the connection block includes four differential signal line rows. Each differential signal line row is disposed between a power signal line (P) row and a ground line (G) row. The first portion 202 of the connection block and the second portion 204 of the connection block are separated by a reference signal line row. The reference signal line row includes two termination voltage signal lines (T), a regulated voltage signal line (R), and an analog voltage supply signal line (A).

Figure 9:
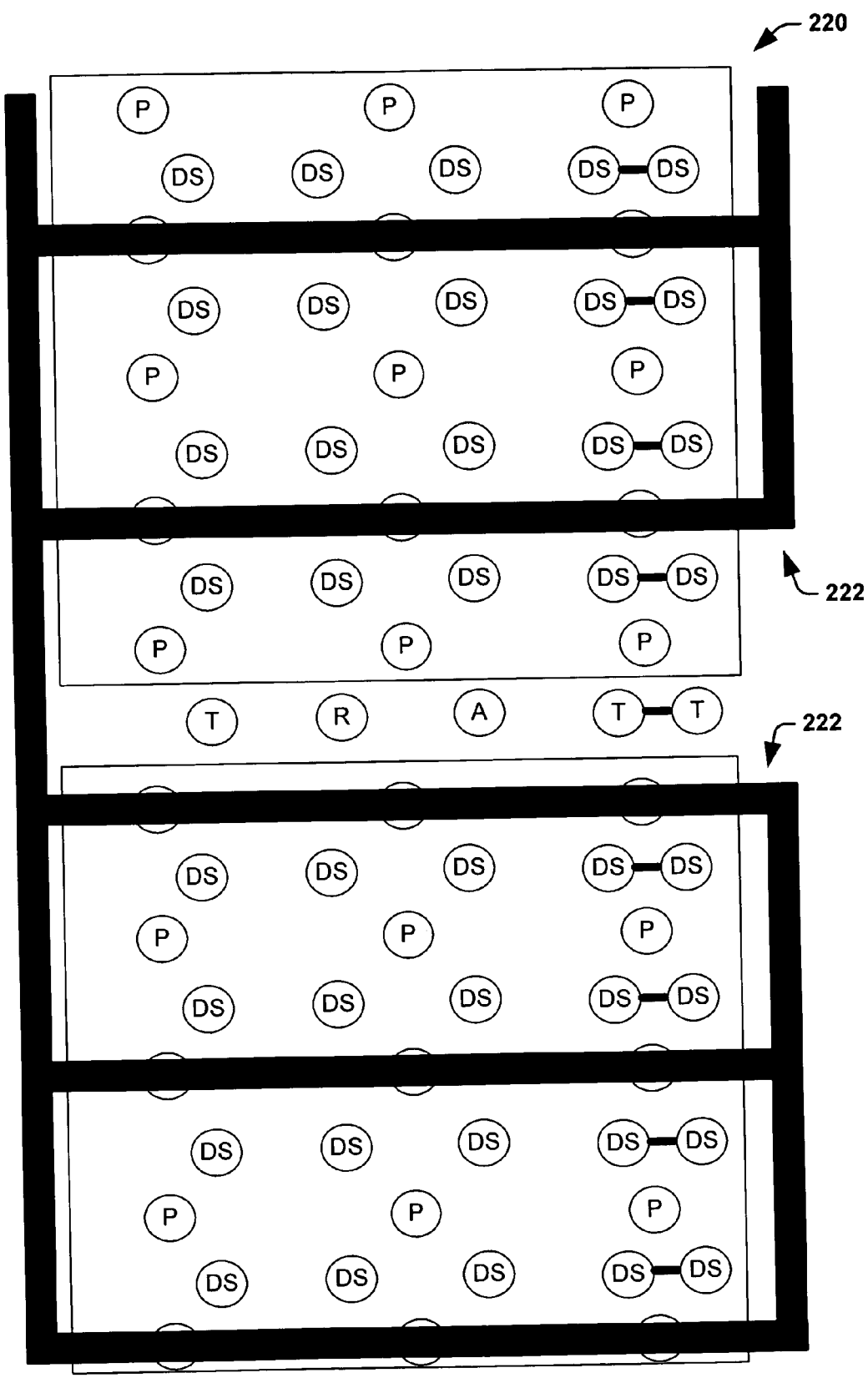
FIG. 9 illustrates an embodiment of a first ground layer associated with the sixteen differential signal line pair connection block.

FIG. 9 illustrates a first ground layer 220 associated with the sixteen differential signal line pair connection block. The first ground layer 220 is spaced apart from the top surface layer by, for example, a dielectric layer. Ground lines associated with the connection block are redistributed in the first ground layer 220 over one or more conductive lines 222. The redistribution of the ground lines in the first ground layer 220 mitigates the need for jogging of the ground lines. Additionally, a first differential signal line associated with a first differential signal line pair of each differential signal line row is jogged at the first ground layer 220 in a same direction along a common plane associated with the respective differential signal line row. Each of the common planes associated with each of the differential signal line rows are substantially transverse to a top surface of the multilayer substrate and substantially parallel with one another. Additionally, a first terminal voltage signal line (T) can be jogged in the first ground layer 220 in the same direction as the differential signal lines along a respective common plane that is also substantially transverse to a top surface of the multilayer substrate and substantially parallel with the common planes of the differential signal line rows.

Figure 10:
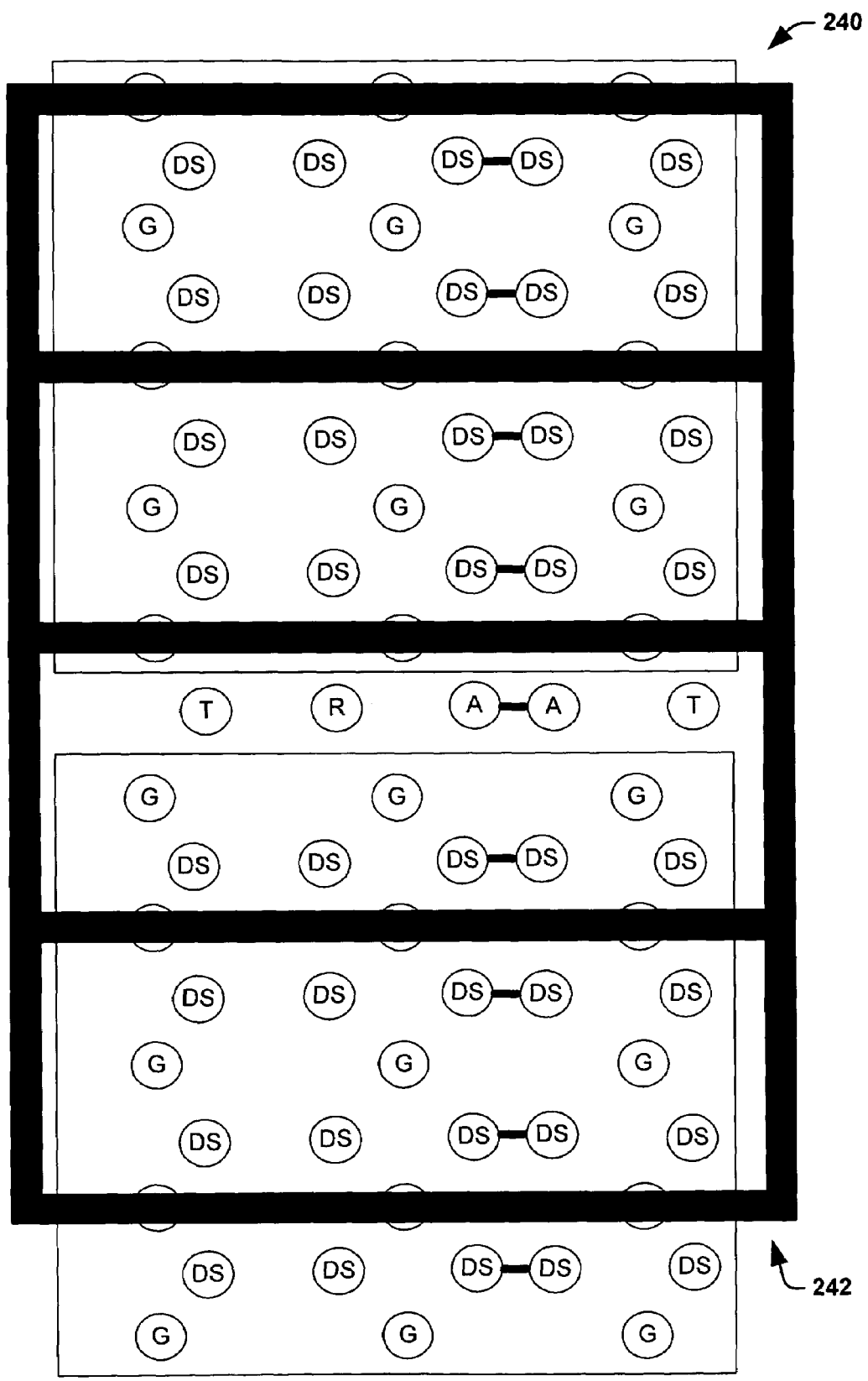
FIG. 10 illustrates an embodiment of a first power layer associated with the sixteen differential signal line pair connection block.

FIG. 10 illustrates a first power layer 240 associated with the sixteen differential signal line pair connection block. The first power layer 240 is spaced apart from the first ground layer 220 by, for example, a dielectric layer. Power lines are redistributed in the first power layer 240 over one or more conductive lines 242. The redistribution mitigates the need for jogging of the power lines. Additionally, a second differential signal line of the first differential signal line pair of each differential signal line row is jogged at the first power layer 240 in a same direction along the common planes associated with the respective differential signal line row as the first differential signal lines was jogged in the first ground layer 220. Additionally, analog voltage supply signal line (A) at the first power layer 240 can be jogged in the same direction as the differential signal lines along its respective common plane.

Figure 11:
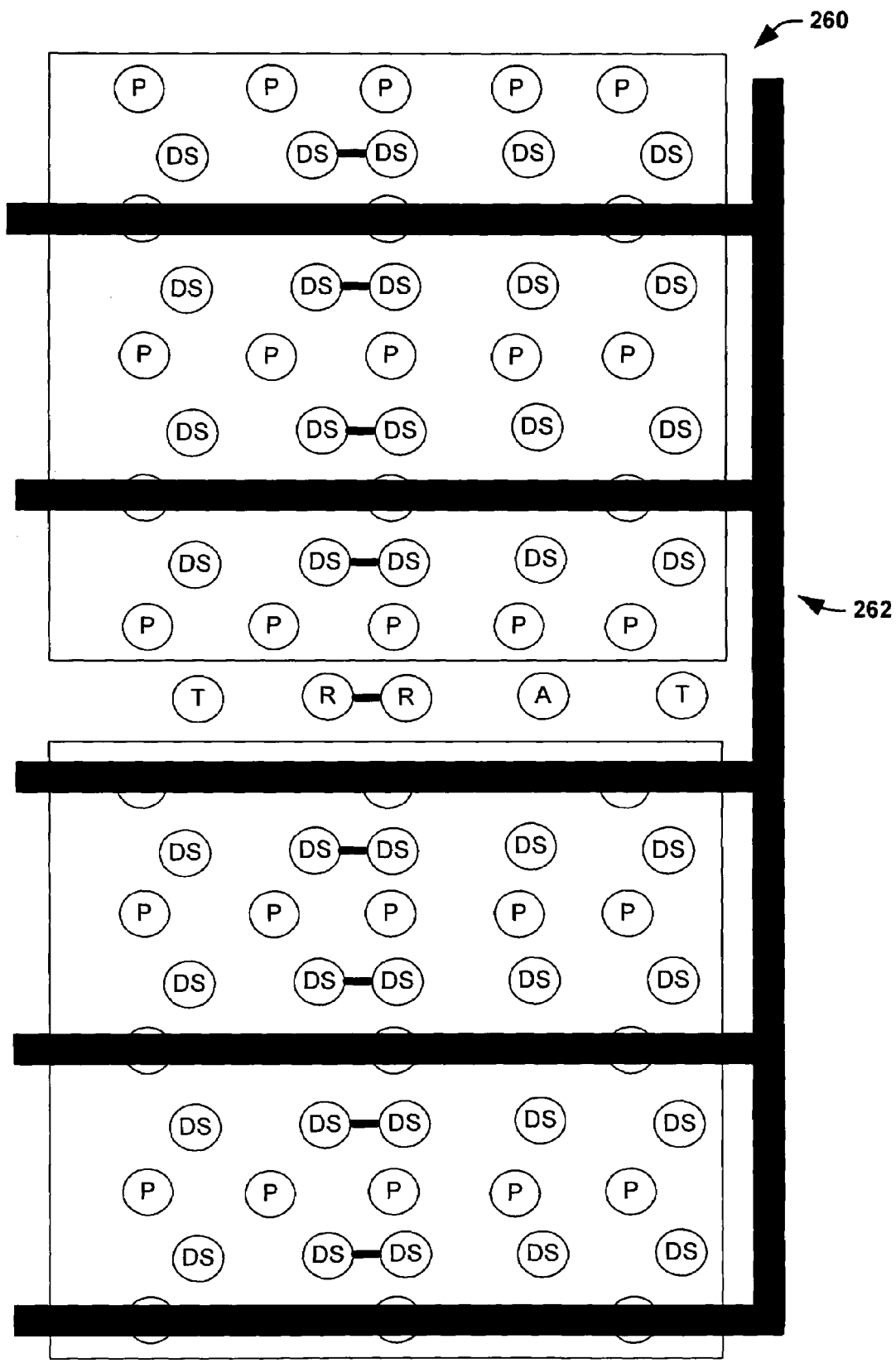
FIG. 11 illustrates an embodiment of a second ground layer associated with the sixteen differential signal line pair connection block.

FIG. 11 illustrates a second ground layer 260 associated with the sixteen differential signal line pair connection block. The second ground layer 260 is spaced apart from the first power layer 240 by, for example, a dielectric layer. Ground signals are redistributed in the second ground layer 260 over one or more conductive lines 262. Additionally, a third differential signal line of a second differential signal line pair of each differential signal line row are jogged at the second ground layer 260 in a same direction along the common planes associated with the respective differential signal line row as the first differential signal lines were jogged in the first ground layer 220. Additionally, regulated voltage signal line (R) can be jogged at the second power layer 260 in the same direction as the differential signal lines along its respective common plane.

Figure 12:
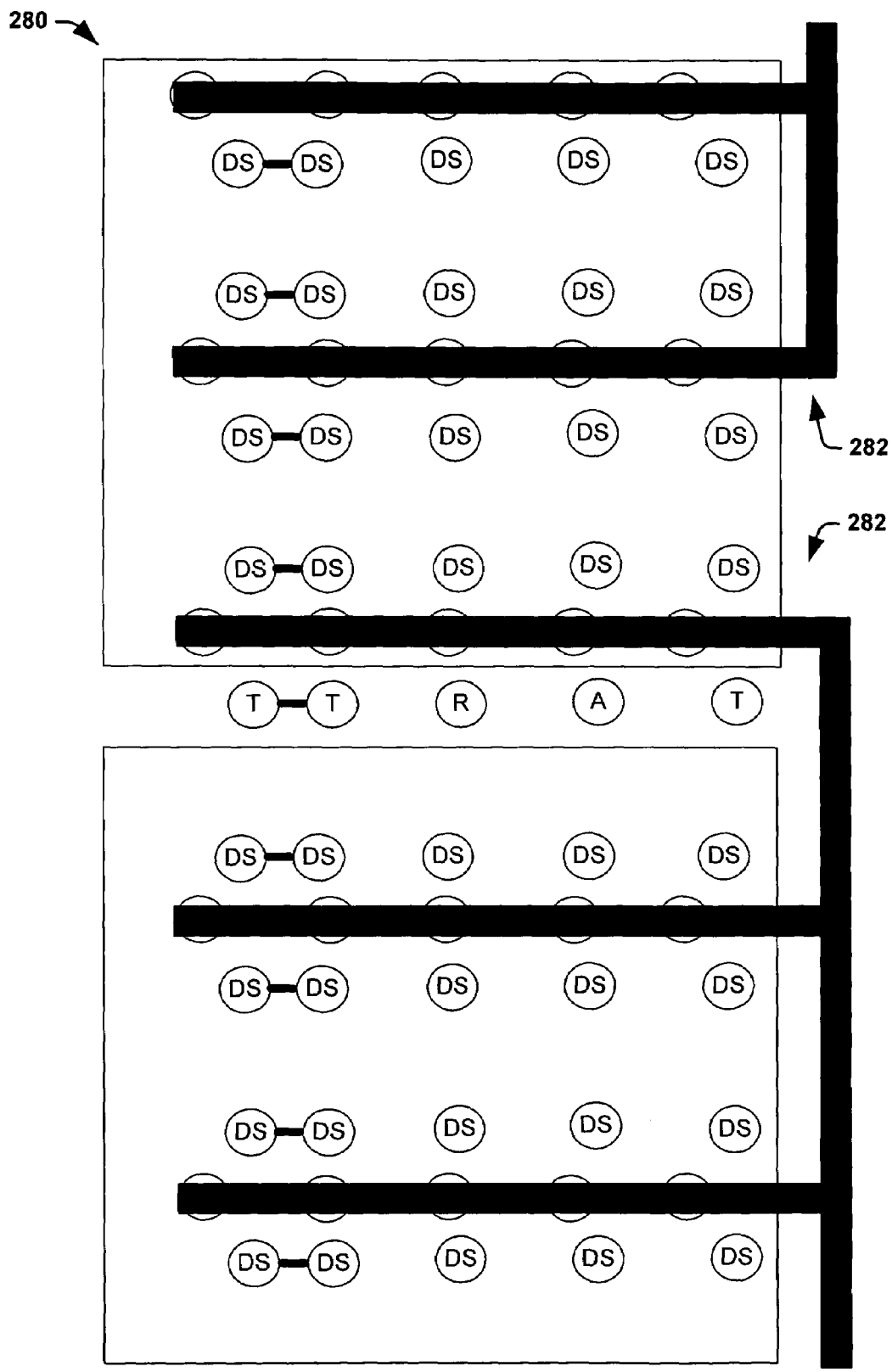
FIG. 12 illustrates an embodiment of a second power layer associated with the sixteen differential signal line pair connection block.

FIG. 12 illustrates a second power layer 280 associated with the sixteen differential signal line pair connection block. The second power layer 280 is spaced apart from the second ground layer 260 by, for example, a dielectric layer. Power lines are redistributed in the power layer over one or more conductive lines 282. The power lines that are redistributed in the second power layer 280 can be associated with the same or different power supply as the power lines in the first power layer 240. Additionally, a fourth differential signal line of the second differential signal line pair of each differential signal line row are jogged at the second power layer 280 in a same direction along the common planes associated with the respective differential signal line row as the first differential signal lines were jogged in the first ground layer 220. It is to be appreciated that the differential signal lines in a common plane associated with a given differential signal line row can be jogged in a same or different direction of the differential signal lines in a different common plane as long as signal lines in adjoining blocks in the same common plane are jogged in the same direction.

Figure 13:
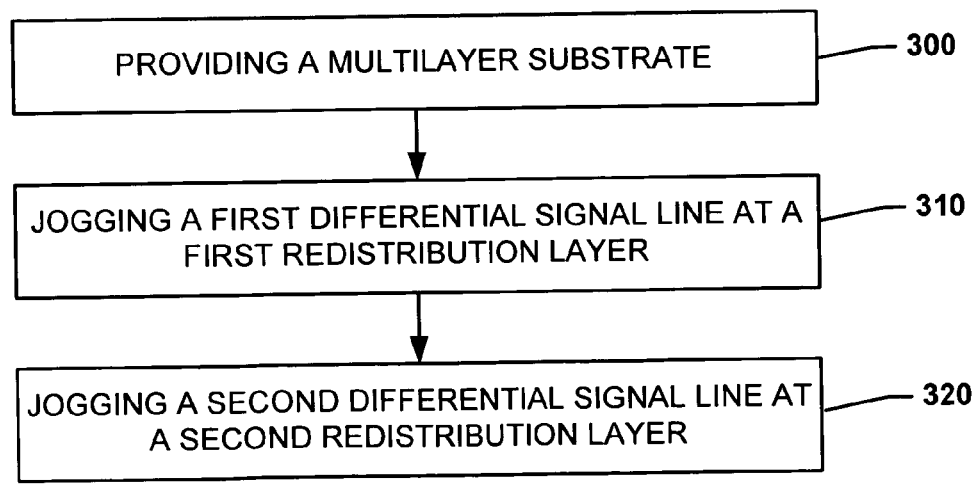
FIG. 13 illustrates an embodiment of a method for routing differential signal lines through a substrate.

FIG. 13 illustrates a methodology for routing signals in a multilayer substrate. At 300, a multilayer substrate is provided with at least one differential signal line pair aligned along a common plane that is substantially transverse to a top surface of the multilayer substrate. At 310, a first differential signal line associated with a first differential signal line pair is jogged at a first redistribution layer in a direction along the common plane. At 320, a second differential signal line associated with the differential signal line pair is jogged at a second redistribution layer along the common plane in a same direction as the first differential signal line to provide a substantially balanced differential signal line pair.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for routing signals in a multilayer substrate, the method comprising:
   providing a multilayer substrate with at least one differential signal line pair aligned along a common plane that is substantially transverse to a top surface of the multilayer substrate;
   jogging a first differential signal line associated with a differential signal line pair at a first redistribution layer in a direction along the common plane; and
   jogging a second differential signal line associated with the differential signal line pair at a second redistribution layer along the common plane in a same direction as the first differential signal line to provide a substantially balanced differential signal line pair, wherein the first redistribution layer is one of a ground layer and a power layer, and the second redistribution layer is one of a ground layer and a power layer.

2. The method of claim 1, further comprising:
   providing a second differential signal line pair aligned along the common plane;
   jogging a third differential signal line associated with the second differential signal line pair at a third redistribution layer along the common plane in a same direction as the first differential signal line; and
   jogging a fourth differential signal line associated with the second differential signal line pair at a fourth redistribution layer along the common plane in as the first differential signal line.

3. The method of claim 2, wherein the first redistribution layer is a first ground layer, the second redistribution layer is a first power layer, the third redistribution layer is a second ground layer and the fourth redistribution layer is a second power layer.

4. The method of claim 1, wherein the first redistribution layer is a ground layer, and the second redistribution layer is a power layer.

5. The method of claim 1, wherein the substrate is a multilayer ceramic (MLC) substrate.

6. The method of claim 1, further comprising providing a plurality of differential signal line groups, each differential signal line group including at least one differential signal line pair aligned in a row along a respective common plane that is transverse to a top surface of the multilayer substrate.

7. The method of claim 6, further comprising
jogging a first differential signal line associated with a differential signal line pair of each differential signal line group at the first redistribution layer in a direction along the common plane associated with the respective differential signal line group; and
jogging a second differential signal line associated with the differential signal line pair of each differential signal line group at the second redistribution layer, in a same direction as the first differential signal line associated with the differential signal line pair of each differential signal line group, along the common plane associated with the respective differential signal line group.

8. The method of claim 7, further comprising:
providing a second differential signal line pair for each differential signal line group aligned along the common plane associated with the respective differential signal line group;
jogging a third differential signal line associated with a second differential signal line pair of each differential signal line group at a third redistribution layer, in a same direction as the first differential signal line associated with each differential signal line group, along the common plane associated with the respective differential signal line group; and
jogging a fourth differential signal line associated with the second differential signal line pair of each group at a fourth redistribution layer, in a same direction as the first differential signal line associated with of each differential signal line group, along the common plane associated with the respective differential signal line group.

9. The method of claim 6, further comprising providing a plurality of signal line connection blocks, each signal line connection block providing a plurality of differential signal line groups, each group including at least one differential signal line pair aligned in a row along a respective common plane that is transverse to a top surface of the multilayer substrate, wherein differential signal line groups being aligned in the same common plane are jogged in a same direction.

10. A method for routing differential signal lines in a multilayer ceramic substrate (MLC), the method comprising:
providing a plurality of differential signal line pair groups, each differential signal line pair group being aligned along a respective common plane that is substantially transverse to a top surface of the multilayer substrate;
jogging a first differential signal line associated with each differential signal line pair group at a first redistribution layer in a direction along the common plane associated with the respective differential signal line pair group; and
jogging a second differential signal line of each differential signal line pair group at a second redistribution layer, in a same direction as the first differential signal line associated with a respective differential signal line pair group, along the common plane associated with the respective differential signal line group, wherein the plurality of differential signal line pair groups are arranged in rows across a plurality of signal line connection blocks, each differential signal line pair group being aligned along a respective common plane across signal line connection blocks are jogged in a same direction.

11. The method of claim 10, wherein the first differential signal line and the second differential signal line of each differential signal line group form a differential signal line pair associated with the respective differential signal line group.

12. The method of claim 11, further comprising:
jogging a third differential signal line of each differential signal line pair group at a third redistribution layer, in a same direction as the first differential signal line associated with a respective differential signal line pair group, along the common plane associated with the respective differential signal line group; and
jogging a fourth differential signal line of each differential signal line pair group at a fourth redistribution layer, in a same direction as the first differential signal line associated with a respective differential signal line pair group, along the common plane associated with the respective differential signal line group.

13. The method of claim 12, wherein the third differential signal line and the fourth differential signal line of each differential signal line group form a second differential signal line pair associated with the respective differential signal line group.

14. The method of claim 12, wherein the first redistribution layer is a first ground layer, the second redistribution layer is a first power layer, the third redistribution layer is a second ground layer and the fourth redistribution layer is a second power layer.

15. The method of claim 10, wherein the first redistribution layer is one of a around layer and a power layer and the second redistribution layer is one of a ground layer and a power layer.

16. The method of claim 15, wherein each of the plurality of signal line connection blocks include two rows of four differential signal lines that form two differential signal line pairs per row, each row of differential signal lines being aligned along a respective common plane.

17. The method of claim 15, wherein each of the plurality of signal line connection blocks include eight rows of four differential signal lines that form two differential signal line pairs per row, each row of differential signal lines being aligned along a respective common plane.

18. A multilayer substrate comprising:
a first differential signal line associated with a differential signal line pair that is jogged a given distance at a first redistribution layer in a direction along a common plane that is substantially transverse with a top surface of the substrate; and
a second differential signal line associated with the differential signal line pair that is jogged substantially the same given distance at a second redistribution layer along the common plane in a same direction as the first differential signal line to provide a substantially balanced differential signal line pair, wherein the first redistribution layer is one of a ground layer and a power layer, and the second redistribution layer is one of a power layer and a ground layer.

19. The substrate of claim 18, further comprising:
a third differential signal line associated with a second differential signal line pair that is jogged a second given distance at a third redistribution layer along the common plane in a same direction as the first differential signal line; and
a fourth differential signal line associated with the second differential signal line pair that is jogged substantially the same second given distance at a fourth redistribution layer along the common plane in a same direction as the first differential signal line.

20. The substrate of claim 19, wherein the given distance is substantially the same as the second given distance.

21. The substrate of claim 19, wherein the first redistribution layer is a first ground layer, the second redistribution layer is a first power layer, the third redistribution layer is a second ground layer and the fourth redistribution layer is a second power layer.

22. The substrate of claim 18, wherein the first redistribution layer is a ground layer, and the second redistribution layer is a power layer.

23. The substrate of claim 18, further comprising a plurality of differential signal line groups, each group including at least one differential signal line pair aligned in a row along a respective common plane that is transverse to a top surface of the multilayer substrate.

24. The substrate of claim 18, further comprising:
a first differential signal line associated with a differential signal line pair of each group that is jogged at the first redistribution layer, in a direction along the common plane associated with the respective differential signal line group; and
a second differential signal line associated with the differential signal line pair of each group that is jogged at the second redistribution layer, in a same direction as the first differential signal line associated with a respective differential signal line pair group, along the common plane associated with the respective differential signal line group.

25. The substrate of claim 24, further comprising:
a third differential signal line associated with a second differential signal line pair of each group that is jogged at a third redistribution layer, in a same direction as the first differential signal line associated with a respective differential signal line pair group, along the common plane associated with the respective differential signal line group; and
a fourth differential signal line associated with the differential signal line pair of each group that is jogged at a fourth redistribution layer, in a same direction as the first differential signal line associated with a respective differential signal line pair group, along the common plane associated with the respective differential signal line group.

26. The substrate of claim 25, further comprising a plurality of signal line connection blocks, each signal line connection block providing a plurality of differential signal line groups, each group including at least one differential signal line pair aligned in a row along a respective common plane that is transverse to a top surface of the multilayer substrate, wherein differential signal line groups being aligned in the same common plane are jogged in a same direction.

27. The substrate of claim 26, wherein each of the plurality of signal line connection blocks include two rows of four differential signal lines that form two differential signal line pairs per row, each row of differential signal lines being aligned along a respective common plane.

28. The substrate of claim 26, wherein each of the plurality of signal line connection blocks include eight rows of four differential signal lines that form two differential signal line pairs per row, each row of differential signal lines being aligned along a respective common plane.

29. The substrate of claim 18, comprising a multilayer ceramic (MLC) substrate.

\* \* \* \* \*

UNITED STATES PATENT AND TRADEMARK OFFICE
CERTIFICATE OF CORRECTION

| | | |
|---|---|---|
| PATENT NO. | : 7,078,812 B2 | Page 1 of 1 |
| APPLICATION NO. | : 10/929989 | |
| DATED | : July 18, 2006 | |
| INVENTOR(S) | : Mark D. Frank et al. | |

It is certified that error appears in the above-identified patent and that said Letters Patent is hereby corrected as shown below:

In column 11, line 11, in Claim 7, after "comprising" insert -- : --.

In column 11, line 40, in Claim 8, after "with" delete "of each" and insert -- each of --, therefor.

In column 12, line 39, in Claim 15, delete "around" and insert -- ground --, therefor.

Signed and Sealed this

Twenty-fourth Day of March, 2009

JOHN DOLL
*Acting Director of the United States Patent and Trademark Office*